(12) United States Patent
Hayasaka et al.

(10) Patent No.: US 11,869,750 B2
(45) Date of Patent: Jan. 9, 2024

(54) PLASMA PROCESSING APPARATUS

(71) Applicant: Tokyo Electron Limited, Tokyo (JP)

(72) Inventors: Yusuke Hayasaka, Miyagi (JP);
Takehiro Tanikawa, Miyagi (JP);
Shuhei Yamabe, Miyagi (JP); Yuki Machida, Miyagi (JP); Jun Young Chung, Gyeonggi-do (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/272,771

(22) PCT Filed: Aug. 23, 2019

(86) PCT No.: PCT/JP2019/033142
§ 371 (c)(1),
(2) Date: Mar. 2, 2021

(87) PCT Pub. No.: WO2020/050071
PCT Pub. Date: Mar. 12, 2020

(65) Prior Publication Data
US 2021/0272779 A1    Sep. 2, 2021

(30) Foreign Application Priority Data

Sep. 6, 2018 (JP) .................... 2018-166972
Jun. 5, 2019 (JP) .................... 2019-105393

(51) Int. Cl.
*H01J 37/32* (2006.01)

(52) U.S. Cl.
CPC .. *H01J 37/32522* (2013.01); *H01J 37/32504* (2013.01)

(58) Field of Classification Search
CPC ............ C23C 16/4404; C23C 16/4409; C23C 16/4411; H01J 37/321; H01J 37/32183; H01J 37/32477; H01J 37/32504; H01J 37/32513; H01J 37/32522; H01J 37/32807; H01J 2237/002; H01J 2237/0268
See application file for complete search history.

(56) References Cited

U.S. PATENT DOCUMENTS 5,736,021 A * 4/1998 Ding ............... H01J 37/32504
204/192.12
6,177,646 B1 * 1/2001 Okumura .......... H01J 37/32522
156/345.48

(Continued)

FOREIGN PATENT DOCUMENTS

CN          1551302 A     12/2004
CN        107408486 A     11/2017

(Continued)

*Primary Examiner* — Benjamin Kendall
(74) *Attorney, Agent, or Firm* — Nath, Goldberg & Meyer; Jerald L. Meyer; Tanya E. Harkins (57) ABSTRACT

A plasma processing apparatus according to an exemplary embodiment includes a chamber, a member, and a heater. Plasma is generated in an internal space of the chamber. The member is partially located in the internal space of the chamber. The heater is configured to heat the member. The member extends outward from the internal space of the chamber and is exposed to a space outside the chamber.

12 Claims, 5 Drawing Sheets

(56) References Cited

U.S. PATENT DOCUMENTS

| | | | |
|---|---|---|---|
| 8,444,926 B2* | 5/2013 | Fodor | C23C 16/46 156/345.37 |
| 9,734,993 B2* | 8/2017 | Kobayashi | H01J 37/32467 |
| 10,804,120 B2* | 10/2020 | Ha | H01J 37/32458 |
| 2006/0213617 A1* | 9/2006 | Fink | H01J 37/32495 156/345.47 |
| 2015/0059981 A1* | 3/2015 | Huston | C23C 16/46 118/733 |
| 2015/0129129 A1* | 5/2015 | Shimizu | C23C 16/4401 156/345.3 |
| 2018/0233327 A1* | 8/2018 | Kalnin | C23C 16/45591 |

FOREIGN PATENT DOCUMENTS

| | | |
|---|---|---|
| JP | 9-162170 A | 6/1997 |
| JP | 2008-505489 A | 2/2008 |
| JP | 2010-507231 A | 3/2010 |
| JP | 2010238944 A | 10/2010 |
| JP | 2011124362 A | 6/2011 |
| JP | 2012-138497 A | 7/2012 |
| JP | 2014-130924 A | 7/2014 |

\* cited by examiner

PLASMA PROCESSING APPARATUS

This is a National Phase Application filed under 35 U.S.C. 371 as a national stage of PCT/JP2019/033142, filed Aug. 23, 2019, an application claiming the benefit of Japanese Application No. 2018-166972, filed Sep. 6, 2018, and Japanese Application No. 2019-105393, filed Jun. 5, 2019, the content of each of which is hereby incorporated by reference in its entirety.

TECHNICAL FIELD

An exemplary embodiment of the present disclosure relates to a plasma processing apparatus.

BACKGROUND

In the manufacture of electronic devices, plasma processing is performed on a substrate. A plasma processing apparatus is used for plasma processing. The plasma processing apparatus includes a chamber. The inner wall of the chamber is covered with a shield member in order to prevent byproducts generated by the plasma processing from accumulating on the inner wall. Such a plasma processing apparatus is disclosed in Patent Document 1 below.

PRIOR ART DOCUMENT

[Patent Document]
Patent Document 1: Japanese Laid-Open Patent Publication No. 2012-138497

SUMMARY

The plasma processing apparatus is required to control the temperature of a member provided inside a chamber, such as the shield member.

In an exemplary embodiment, there is provided a plasma processing apparatus for performing a plasma processing. The plasma processing apparatus includes a chamber, a member, and a heater. The member is partially located in an internal space of the chamber. The heater is configured to heat the member. The member extends outward from the internal space of the chamber and is exposed to a space outside the chamber.

According to a plasma processing apparatus of an exemplary embodiment, it is possible to control a temperature of a member provided inside the chamber.

DETAILED DESCRIPTION

Hereinafter, various exemplary embodiments will be described.

In an exemplary embodiment, there is provided a plasma processing apparatus for performing plasma processing. The plasma processing apparatus includes a chamber, a member, and a heater. The member is partially located in an internal space of the chamber. The heater is configured to heat the member. The member extends outward from the internal space of the chamber and is exposed to a space outside the chamber.

In the plasma processing apparatus according to the above exemplary embodiment, the member is not disposed only in the internal space kept in a depressurized state, but is configured to extend outward from the internal space of the chamber and to come into contact with the atmosphere outside the chamber. Therefore, the member can be sufficiently cooled. In addition, the member is heated by the heater. Therefore, it is possible to control the temperature of the member.

In an exemplary embodiment, the member may be made of aluminum.

In another exemplary embodiment, the plasma processing apparatus may further include a spacer provided between the chamber and the member. The spacer increases a thermal resistance between the chamber and the member. Therefore, an increase in temperature of the chamber can be suppressed.

In one exemplary embodiment, the spacer may be made of a material that has a thermal conductivity lower than that of aluminum. The spacer may be made of, for example, stainless steel. Such a spacer has high thermal resistance.

In an exemplary embodiment, the member may extend along the inner wall of the chamber so as to prevent byproducts generated by the plasma processing from accumulating on the inner wall of the chamber.

In another exemplary embodiment, the plasma processing apparatus further includes a heater unit. The heater unit includes a main body and the above-mentioned heater. The heater is provided inside the main body. The main body of the heater unit is provided so as to be in thermal contact with the member.

Hereinafter, various exemplary embodiments will be described in detail with reference to the drawings. In the drawings, the same or corresponding parts will be denoted by the same reference numerals.

Figure 1:
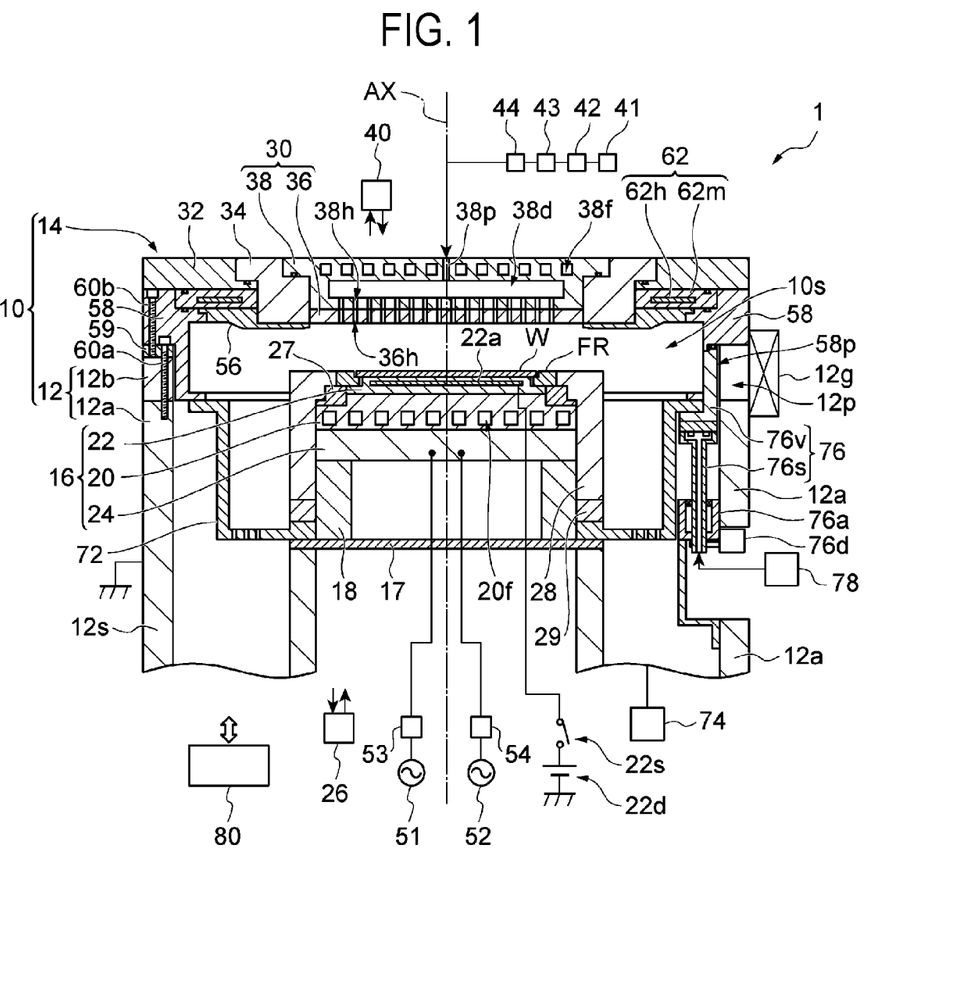
FIG. 1 is a view schematically illustrating a plasma processing apparatus according to an exemplary embodiment.
Figure 2:
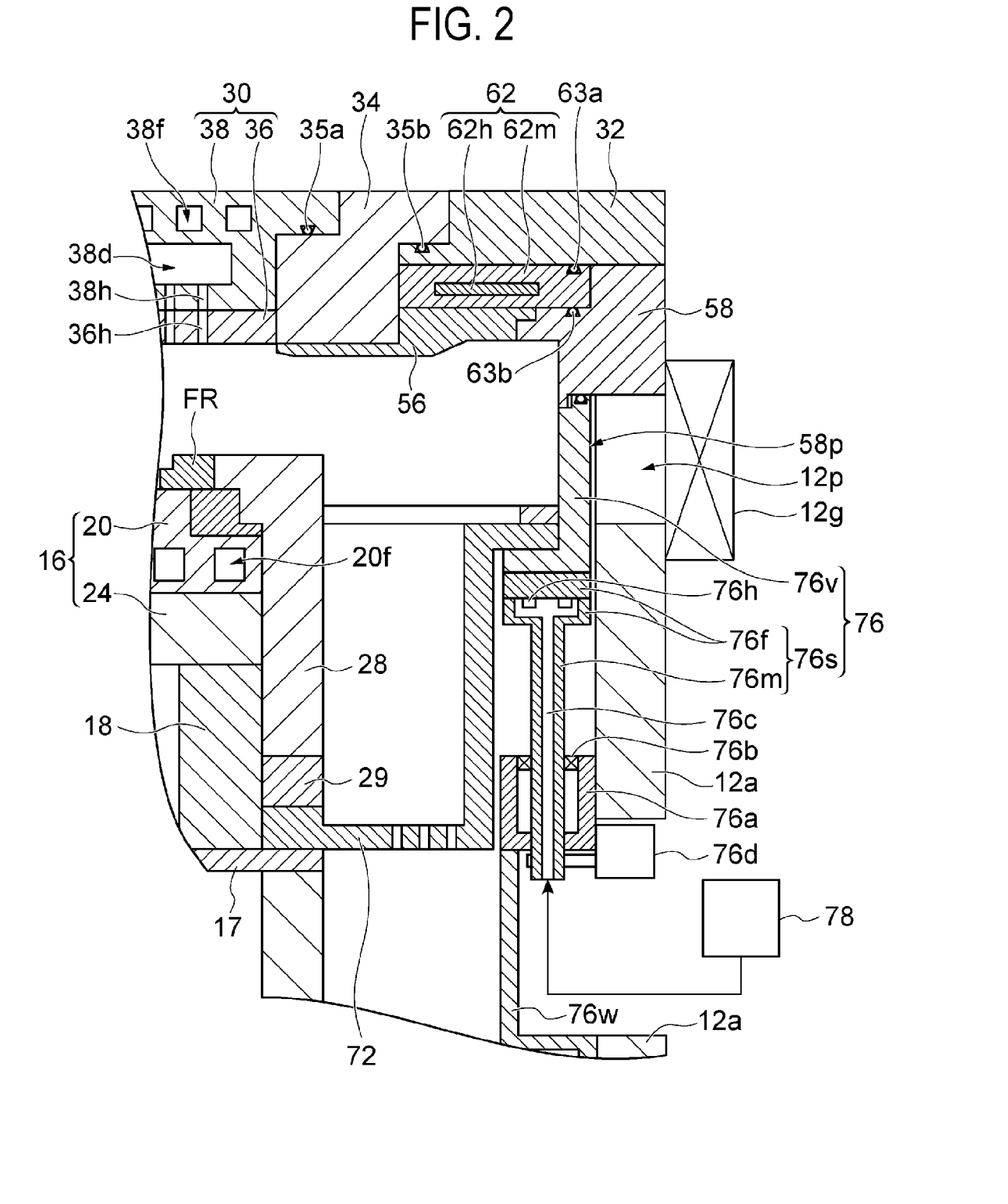
FIG. 2 is a partially enlarged cross-sectional view of the plasma processing apparatus illustrated in FIG. 1.
Figure 3:
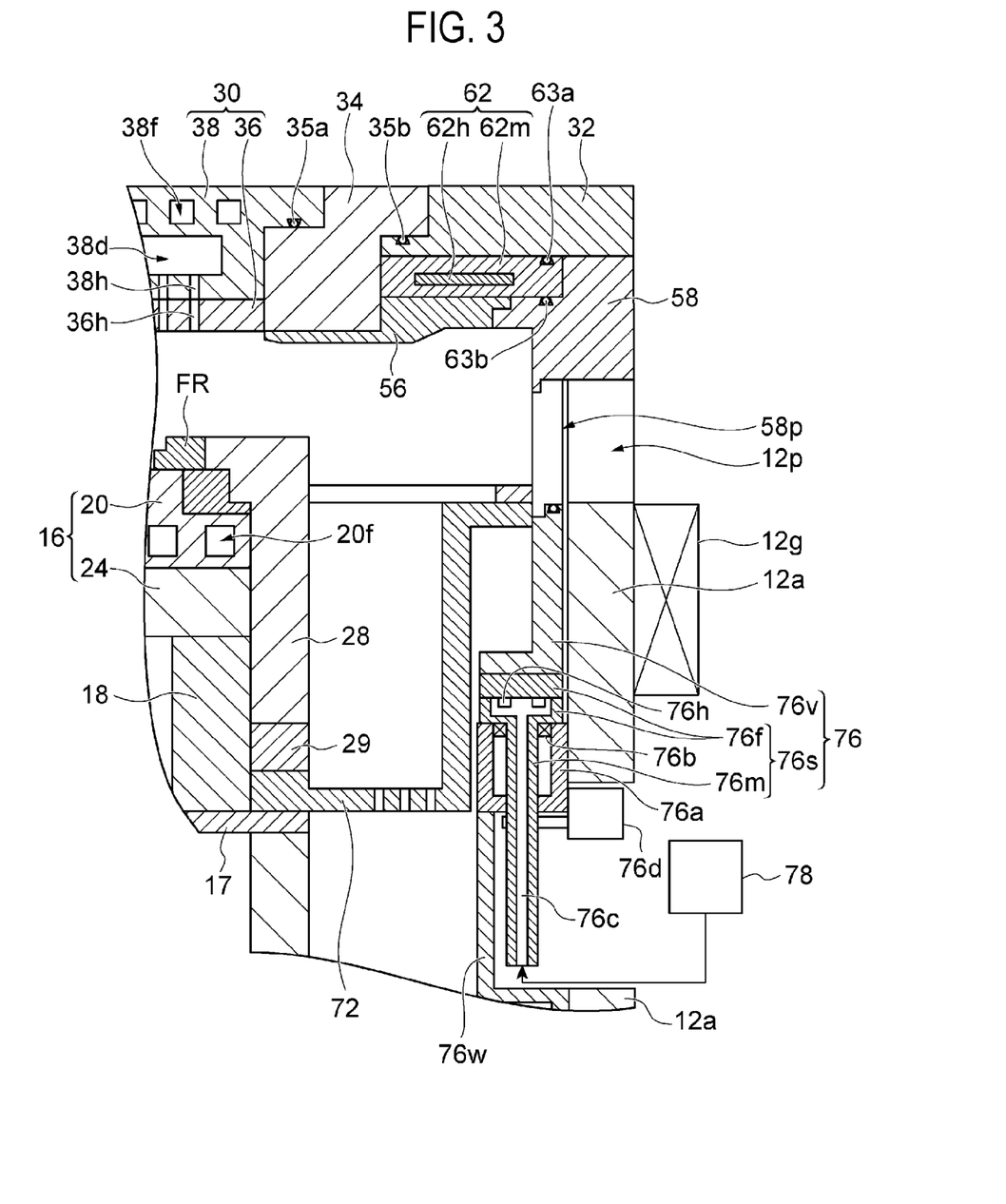
FIG. 3 is a partially enlarged cross-sectional view of the plasma processing apparatus illustrated in FIG. 1.
Figure 4:
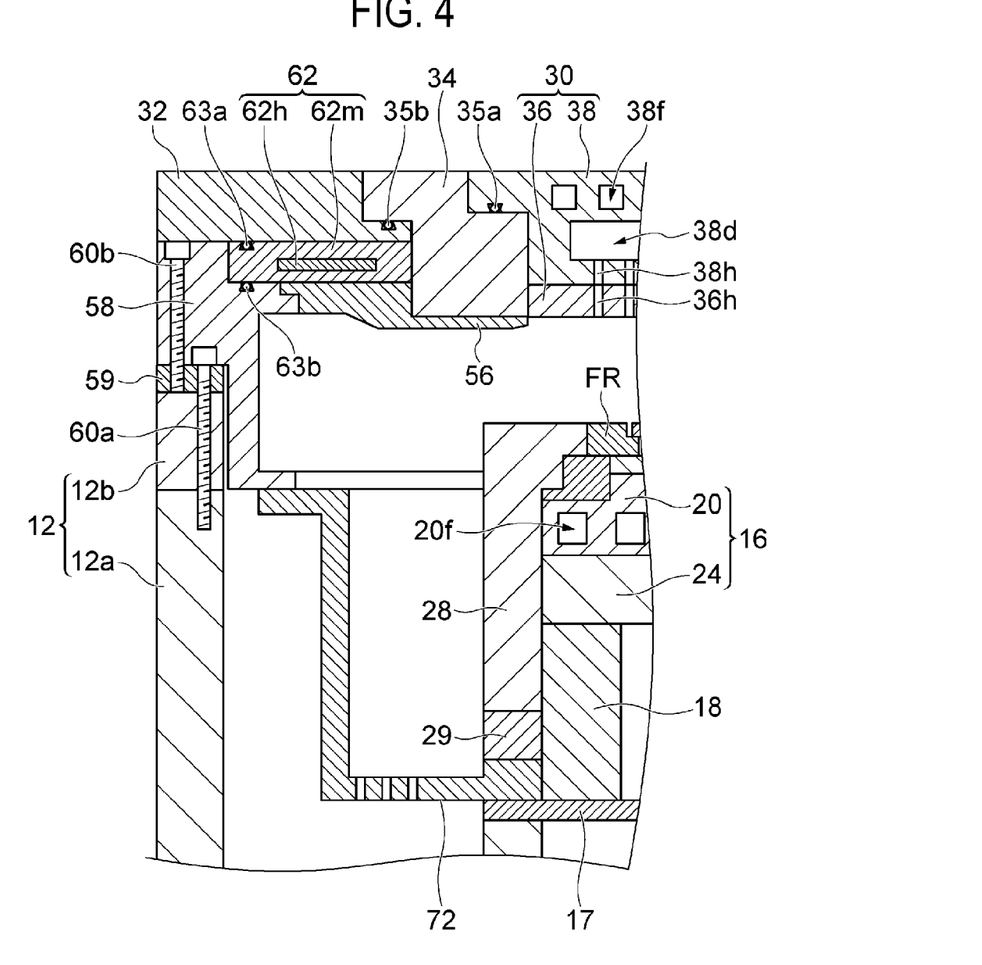
FIG. 4 is a partially enlarged cross-sectional view of the plasma processing apparatus illustrated in FIG. 1.

FIG. 1 is a view schematically illustrating a plasma processing apparatus according to an exemplary embodiment. FIGS. 2, 3, and 4 are partially enlarged cross-sectional views of the plasma processing apparatus illustrated in FIG. 1. FIG. 2 illustrates a state in which a corresponding opening is closed by a valve body of an exemplary shutter mechanism. FIG. 3 illustrates a state in which the valve body of the exemplary shutter mechanism opens the corresponding opening. The plasma processing apparatus 1 illustrated in FIGS. 1 to 4 includes a chamber 10. The chamber 10 has an internal space 10s provided therein. The internal space 10s can be depressurized. Plasma is formed inside the internal space 10s.

The chamber 10 includes a chamber body 12 and a ceiling portion 14. The chamber body 12 constitutes a side wall and bottom portion of the chamber 10. The chamber body 12 has a substantially cylindrical shape. A central axis line of the chamber body 12 substantially coincides with an axis line AX extending in the vertical direction. The chamber body 12 is electrically grounded. The chamber body 12 is made of, for example, aluminum. A corrosion-resistant film is formed on a surface of the chamber body 12. The corrosion-resistant film is made of a material such as an aluminum oxide or an yttrium oxide.

An opening portion 12p is formed in the side wall of the chamber 10. The opening portion 12p is provided by the chamber body 12. The opening portion 12p can be opened or closed by a gate valve 12g. A substrate W passes through the opening portion 12p when transferred between the internal space 10s and the outside of the chamber 10.

In an embodiment, the chamber body 12 includes a first member 12a and a second member 12b. The first member 12a has a substantially cylindrical shape. The first member 12a constitutes a portion of the bottom portion and the side wall of the chamber 10. The second member 12b has a substantially cylindrical shape. The second member 12b is provided on the first member 12a. The second member 12b constitutes another portion of the side wall of the chamber 10. The second member 12b provides the opening portion 12p.

A support pedestal 16 is provided inside the internal space 10s. The support pedestal 16 is configured to support the substrate W placed thereon. A bottom plate 17 is provided below the support pedestal 16. The bottom plate 17 is supported by the bottom portion of the chamber 10, for example, the first member 12a. A support 18 extends upward from the bottom plate 17. The support 18 has a substantially cylindrical shape. The support 18 is made of an insulator such as quartz. The support pedestal 16 is mounted on the support 18 and is supported by the support 18.

The support pedestal 16 includes a lower electrode 20 and an electrostatic chuck 22. The support pedestal 16 may further include an electrode plate 24. The electrode plate 24 has a substantially disk shape. A central axis line of the electrode plate 24 substantially coincides with the axis line AX. The electrode plate 24 is made of a conductor such as aluminum.

The lower electrode 20 is provided on the electrode plate 24. The lower electrode 20 is electrically connected to the electrode plate 24. The lower electrode 20 has a substantially disk shape. A central axis line of the lower electrode 20 substantially coincides with the axis line AX. The lower electrode 20 is formed of a conductor such as aluminum. A flow path 20f is formed inside the lower electrode 20. The flow path 20f extends, for example, in a spiral shape. A coolant is supplied from a chiller unit 26 to the flow path 20f. The chiller unit 26 is provided outside the chamber 10. The chiller unit 26 supplies, for example, a liquid coolant to the flow path 20f. The coolant supplied to the flow path 20f is returned to the chiller unit 26.

The electrostatic chuck 22 is provided on the lower electrode 20. The electrostatic chuck 22 includes a main body and an electrode 22a. The main body of the electrostatic chuck 22 has a substantially disk shape. A central axis line of the electrostatic chuck 22 substantially coincides with the axis line AX. The main body of the electrostatic chuck 22 is made of ceramic. The electrode 22a is a film made of a conductor. The electrode 22a is provided inside the main body of the electrostatic chuck 22. A DC power supply 22d is connected to the electrode 22a via a switch 22s. When the substrate W is held by the electrostatic chuck 22, a voltage from the DC power supply 22d is applied to the electrode 22a. When the voltage is applied to the electrode 22a, an electrostatic attractive force is generated between the electrostatic chuck 22 and the substrate W. The substrate W is attracted to the electrostatic chuck 22 by the generated electrostatic attractive force and is held by the electrostatic chuck 22. The plasma processing apparatus 1 may provide a gas line for supplying a heat transfer gas (e.g., helium gas) between the electrostatic chuck 22 and a rear surface of the substrate W.

A focus ring FR is disposed on the periphery of the electrostatic chuck 22 to surround the substrate W. The focus ring FR is used to improve the in-plane uniformity of plasma processing with respect to the substrate W. The focus ring FR is made of, for example, silicon, quartz, or silicon carbide. A ring 27 is provided between the focus ring FR and the lower electrode 20. The ring 27 is made of an insulator.

The plasma processing apparatus 1 may further include a tubular portion 28 and a tubular portion 29. The tubular portion 28 extends along the outer peripheries of the support pedestal 16 and the support 18. The tubular portion 28 is provided on the tubular portion 29. The tubular portion 28 is made of a corrosion-resistant insulator. The tubular portion 28 is made of, for example, quartz. The tubular portion 29 extends along the outer periphery of the support 18. The tubular portion 29 is made of a corrosion-resistant insulator. The tubular portion 29 is made of, for example, quartz.

The ceiling portion 14 is provided so as to close an upper end opening of the chamber 10. The ceiling portion 14 includes an upper electrode 30. The ceiling portion 14 may further include a member 32 (an upper component) and a member 34. The member 32 is a substantially annular plate, and is made of a metal such as aluminum. The member 32 is provided on the side wall of the chamber 10 via a member 58 to be described later. That is, the member 32 is provided on the member 58. The member 34 is provided between the upper electrode 30 and the member 32. The member 34 extends in the circumferential direction with respect to the axis line AX. The member 34 is made of an insulator such as quartz. The upper electrode 30 is disposed inside the opening defined by the member 32 through the member 34. The upper electrode 30 is supported by the member 32 via the member 34. A sealing member 35a, such as an O-ring, is provided between the upper electrode 30 and the member 34. A sealing member 35b, such as an O-ring, is provided between the member 34 and the member 32.

The upper electrode 30 includes a ceiling plate 36 and a support 38. The ceiling plate 36 has a substantially disk shape. The ceiling plate 36 is in contact with the internal space 10s. A plurality of gas ejection holes 36h are formed in the ceiling plate 36. The plurality of gas ejection holes 36h penetrate the ceiling plate 36 in a thickness direction (vertical direction) of the ceiling plate 36. The ceiling plate 36 is made of silicon, aluminum oxide, or quartz. Alternatively, the ceiling plate 36 may be configured by forming a corrosion-resistant film on a surface of a member made of a conductor such as aluminum. The corrosion-resistant film is made of a material such as an aluminum oxide or an yttrium oxide.

The support 38 is provided above the ceiling plate 36. The support 38 detachably supports the ceiling plate 36. The support 38 is made of, for example, aluminum. A flow path 38f is formed in the support 38. The flow path 38f extends inside the support 38, for example, in a spiral shape. A coolant is supplied from a chiller unit 40 to the flow path 38f. The chiller unit 40 is provided outside the chamber 10. The chiller unit 40 supplies a liquid coolant (e.g., cooling water) to the flow path 38f. The coolant supplied to the flow path 38f is returned to the chiller unit 40. The chiller unit 40 is capable of supplying the coolant to the flow path 38f at a flow rate of, for example, 4 L/min or more.

A gas diffusion chamber 38d is formed inside the support 38. A plurality of holes 38h are formed in the support 38. The plurality of holes 38h extend downward from the gas diffusion chamber 38d, and are connected to the plurality of gas ejection holes 36h, respectively. The support 38 is provided with a port 38p. The port 38p is connected to the gas diffusion chamber 38d. A gas source group 41 is connected to the port 38p via a valve group 42, a flow rate controller group 43, and a valve group 44.

The gas source group 41 includes a plurality of gas sources. Each of the valve group 42 and the valve group 44 includes a plurality of valves. The flow rate controller group 43 includes a plurality of flow rate controllers. Each of the plurality of flow rate controllers is a mass flow controller or a pressure-controlled flow rate controller. Each of the plurality of gas sources of the gas source group 41 is connected to the port 38p via a corresponding valve of the valve group 44, a corresponding flow rate controller of the flow rate controller group 43, and a corresponding valve of the valve group 42. In the plasma processing apparatus 1, gas from each of one or more gas sources selected from the plurality of gas sources of the gas source group 41 is supplied to the gas diffusion chamber 38d. The gas supplied to the gas diffusion chamber 38d is supplied to the internal space 10s from the plurality of gas ejection holes 36h.

The plasma processing apparatus 1 further includes a first radio frequency power supply 51 and a second radio frequency power supply 52. The first radio frequency power supply 51 is a power supply configured to generate a first radio frequency power for plasma generation. A frequency of the first radio frequency power is, for example, 27 MHz or higher. The first radio frequency power supply 51 is electrically connected to the lower electrode 20 via a matcher 53. The matcher 53 has a matching circuit configured to match a load-side impedance (impedance on the side of the lower electrode 20) with an output impedance of the first radio frequency power supply 51. The first high frequency power supply 51 may be connected to the upper electrode 30 via the matcher 53, instead of the lower electrode 20.

The second radio frequency power supply 52 is a power supply configured to generate a second radio frequency power for drawing ions into the substrate W. A frequency of the second radio frequency power is, for example, 13.56 MHz or lower. The second radio frequency power supply 52 is electrically connected to the lower electrode 20 via a matcher 54. The matcher 54 has a matching circuit configured to match a load-side impedance (impedance on the side of the lower electrode 20) with an output impedance of the second radio frequency power supply 52.

The plasma processing apparatus 1 further includes a member 58. The member 58 is partially provided inside the internal space 10s. That is, a portion of the member 58 is exposed to plasma inside the internal space 10s. The member 58 extends outward from the internal space 10s of the chamber 10, and is exposed to a space outside the chamber 10.

In an embodiment, the member 58 extends along the inner wall of the chamber 10 so as to prevent byproducts generated by the plasma processing from accumulating on the inner wall of the chamber 10. Specifically, the member 58 extends along the inner wall of the chamber body 12 or the inner wall of the second member 12b. The member 58 has a substantially cylindrical shape. The member 58 may be configured by forming a corrosion-resistant film on the surface of a member made of a conductor such as aluminum. The corrosion-resistant film is made of a material such as an aluminum oxide or an yttrium oxide.

In an embodiment, the member 58 is sandwiched between the chamber body 12 and the ceiling portion 14. For example, the member 58 is sandwiched between the second member 12b of the chamber body 12 and the member 32 of the ceiling portion 14.

In an embodiment, the plasma processing apparatus 1 may further include a spacer 59. The spacer 59 has a plate shape and extends in the circumferential direction around the axis line AX. The spacer 59 is provided between the member 58 and the chamber 10. The spacer 59 is made of, for example, a conductor. The spacer 59 may be made of a material having a thermal conductivity lower than that of aluminum. The spacer 59 may be made of, for example, stainless steel. The spacer 59 may be made of a material other than the stainless steel, as long as the material has a thermal conductivity lower than that of aluminum. The spacer 59 may be made of aluminum.

In an embodiment, the spacer 59 is provided between the member 58 and the second member 12b. In an embodiment, the spacer 59 and the second member 12b are fixed to the first member 12a using a screw 60a. The screw 60a penetrates the spacer 59 and the second member 12b, and is threadedly coupled to a screw hole of the first member 12a. The member 58 is fixed to the spacer 59 using a screw 60b. The screw 60b penetrates the member 58, and is threadedly coupled to a screw hole of the spacer 59. According to this embodiment, the spacer 59 and the second member 12b remain fixed to the first member 12a by the screw 60a, even if the member 58 is removed from the chamber 10 for, for example, maintenance thereof. Therefore, it is possible to remove the member 58 from the chamber 10 while maintaining the fixation of the spacer 59 and the second member 12b.

The plasma processing apparatus 1 further includes a heater unit 62. The heater unit 62 includes a main body 62m and a heater 62h. The heater 62h is configured to heat the member 58. The heater 62h may be a resistance heating element. The heater 62h is provided inside the main body 62m. The main body 62m is in thermal contact with the member 58. In an embodiment, the main body 62m is in physical contact with the member 58. The main body 62m is made of a conductor such as aluminum. The heater 62h is configured to heat the member 58 via the main body 62m.

In an embodiment, the main body 62m is a substantially annular plate, which extends in the circumferential direction so as to surround the upper electrode 30. In an embodiment, the ceiling portion 14 further includes a member 56. The member 56 is a substantially annular plate. The member 56 extends in the circumferential direction in an outer area of the ceiling plate 36 in a radial direction. The radial direction is a radiation direction with respect to the axis line AX. The heater unit 62 is provided between the member 56 and the member 32, and between the member 34 and the member 58.

A sealing member, such as an O-ring, is provided between the main body 62m and surrounding members thereof in order to separate the depressurized environment including the internal space 10s and the atmospheric pressure environment. Specifically, a sealing member 63a is provided between the main body 62m and the member 32. In addition, a sealing member 63b is provided between the main body 62m and the member 58.

A baffle member 72 is provided between the member 58 and the support 18. In an embodiment, the baffle member 72 has a substantially cylindrical shape. An upper end of the baffle member 72 is formed in a flange shape. A lower end of the baffle member 72 is formed in a substantially annular shape and extends a radially inward direction. An outer edge of the upper end of the baffle member 72 is coupled to the lower end of the member 58. An inner edge of the lower end of the baffle member 72 is sandwiched between the tubular portion 29 and the bottom plate 17. The baffle member 72 is formed of a plate made of a conductor such as aluminum. A corrosion-resistant film is formed on the surface of the baffle member 72. The corrosion-resistant film is made of a material such as an aluminum oxide or an yttrium oxide. A plurality of through-holes are formed in the baffle member 72.

The internal space 10s includes an exhaust area extending below the baffle member 72. An exhaust device 74 is connected to the exhaust area. The exhaust device 74 includes a pressure regulator, such as an automatic pressure control valve, and a depressurization pump, such as a turbo molecular pump.

An opening 58p is formed in the member 58. The opening 58p is formed in the member 58 so as to face the opening portion 12p. The substrate W passes through the opening portion 12p and the opening 58b when being transferred between the internal space 10s and the outside of the chamber 10.

The plasma processing apparatus 1 may further include a shutter mechanism 76. The shutter mechanism 76 is configured to open/close the opening 58p. The shutter mechanism 76 has a valve body 76v and a shaft body 76s. The shutter mechanism 76 may further include a tubular body 76a, a sealing portion 76b, a wall portion 76w, and a driving part 76d.

The valve body 76v closes the opening 58p in the state of being disposed inside the opening 58p. The valve body 76v is supported by the shaft body 76s. That is, the shaft body 76s is connected to the valve body 76v. The shaft body 76s extends downward from the valve body 76v. The shaft body 76s includes a main portion 76m and a flange 76f. The main portion 76m is formed in a substantially tubular shape. That is, the shaft body 76s has a cavity 76c provided therein. The flange 76f is provided on an upper end of the main portion 76m. The valve body 76v is provided on the flange 76f. The cavity 76c of the shaft body 76s is also formed in the flange 76f. A heater 76h is provided in the flange 76f. The heater 76h is, for example, a resistance heating element. The heater 76h is configured to heat the valve body 76v via the flange 76f.

The tubular body 76a has a tubular shape. The tubular body 76a is directly or indirectly fixed to the chamber body 12. The main portion 76m of the shaft body 76s is configured to be movable up and down through the inside of the tubular body 76a. The driving part 76d generates power for moving the main portion 76m of the shaft body 76s up and down. The driving part 76d includes, for example, a motor.

The sealing portion 76b is provided in the tubular body 76a. The sealing portion 76b closes a gap between the tubular body 76a and the main portion 76m of the shaft body 76s so as to secure the airtightness of the internal space 10s. The sealing portion 76b may be, but is not particularly limited, an O-ring or a magnetic fluid seal. The wall portion 76w extends between the tubular body 76a and the chamber body 12. The wall portion 76w closes a gap between the tubular body 76a and the chamber body 12 so as to secure the airtightness of the internal space 10s.

The plasma processing apparatus 1 may further include a feeder 78. The feeder 78 is configured to feed coolant to the cavity 76c. The coolant is, for example, air, cooling air, or an inert gas. When the coolant is fed to the shaft body 76s of the shutter mechanism 76, the valve body 76v is indirectly cooled. Therefore, it is possible to indirectly cool the valve body 76v without directly feeding the coolant to the valve body 76v.

In an embodiment, the plasma processing apparatus 1 may further include a controller 80. The controller 80 is configured to control each part of the plasma processing apparatus 1. The controller 80 is, for example, a computer device. The controller 80 includes a processor, a storage part, an input device such as a keyboard, a display device, and a signal input/output interface. A control program and recipe data are stored in the storage part. The processor executes the control program and sends a control signal to each part of the plasma processing apparatus 1 via the input/output interface according to the recipe data.

As described above, in the plasma processing apparatus 1, the member 58 is not disposed only in the internal space 10s kept in a depressurized state, but extends outward from the internal space 10s of the chamber 10 so as to be in contact with the atmosphere outside the chamber 10. Therefore, the member 58 can be sufficiently cooled. In addition, the member 58 is heated by the heater 62h. Therefore, it is possible to control the temperature of the member 58.

In an embodiment, as described above, the spacer 59 may be provided between the chamber 10 and the member 58. The spacer 59 increases the thermal resistance between the chamber 10 and the member 58. Therefore, when plasma is generated in the internal space 10s, even if the temperature of the member 58 rises due to the heat from the plasma, an increase in temperature of the chamber 10 can be suppressed.

In an embodiment, the spacer 59 may be made of a material (e.g., stainless steel) having a thermal conductivity lower than that of aluminum. The material of the spacer 59 has high thermal resistance. Therefore, according to this embodiment, when plasma is generated in the internal space 10s, an increase in temperature of the chamber 10 can be further suppressed.

Figure 5:
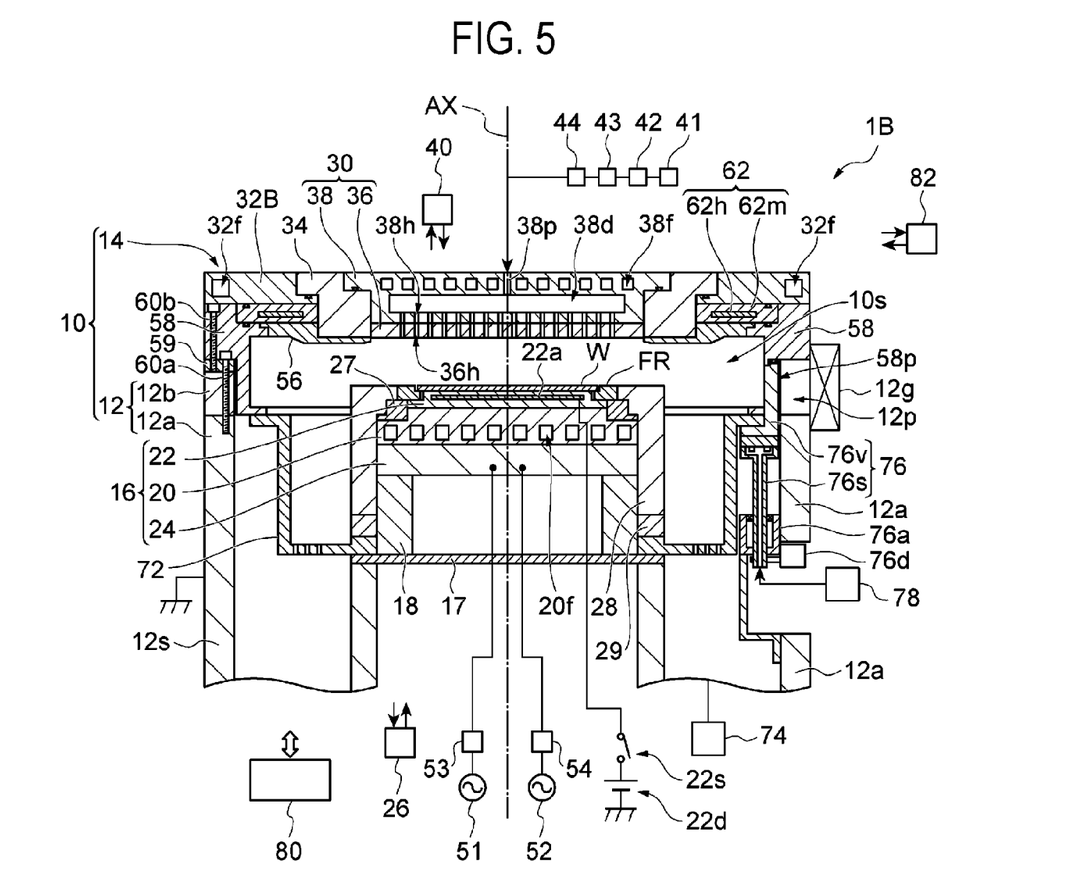
FIG. 5 is a view schematically illustrating a plasma processing apparatus according to another exemplary embodiment.

Hereinafter, another exemplary embodiment will be described with reference to FIG. 5. FIG. 5 is a view schematically illustrating a plasma processing apparatus according to another exemplary embodiment. A plasma processing apparatus 1B illustrated in FIG. 5 includes a member 32B (an upper component), rather than the member 32. The other configuration of the plasma processing apparatus 1B is similar to that of the plasma processing apparatus 1.

The member 32B is the same member as the member 32, but differs from the member 32 in that a flow path 32f is formed in the member 32B. In an example, the flow path 32f extends in the circumferential direction around the axis line AX. A coolant is supplied from a chiller unit 82 to the flow path 32f. The chiller unit 82 is provided outside the chamber 10. The chiller unit 82 supplies, for example, a liquid coolant to the flow path 32f. The coolant supplied to the flow path 32f is returned to the chiller unit 82.

With the plasma processing apparatus 1B, it is possible to cool the member 58 by feeding the coolant to the member 32B. As a result, it is possible to set a temperature of the member 58 to a relatively low temperature at which the member 58 can be safely handled. The member 58 has a through-hole through which the screw 60b passes. Therefore, there is little or no area left in the member 58 for the coolant flow path. Meanwhile, the member 32B is capable of securing an area for the flow path 32f therein. In addition, since the member 32B extends on the member 58 and is in thermal contact with the member 58, it is possible to cool the member 58 by heat exchange between the member 58 and the member 32B and heat exchange between the member 32B and the coolant.

Although various exemplary embodiments have been described above, the present disclosure is not limited to the exemplary embodiments described above, and various omissions, substitutions, and changes may be made. In addition, elements in different embodiments may be combined to form other embodiments.

For example, the plasma processing apparatus 1 is a capacitively coupled plasma processing apparatus, but in another embodiment, the plasma processing apparatus may be another type of plasma processing apparatus. Examples of another type of plasma processing apparatus may include an inductively coupled plasma processing apparatus or a plasma processing apparatus configured to generate plasma using surface waves such as microwaves.

From the foregoing, it should be understood that various exemplary embodiments of the present disclosure have been described herein for purposes of illustration, and that various modifications can be made without departing from the scope and spirit of the present disclosure. Accordingly, the various exemplary embodiments disclosed herein are not intended to be limiting, and the true scope and spirit thereof are represented by the appended claims.

EXPLANATION OF REFERENCE NUMERALS

1: plasma processing apparatus, 10: chamber, 10s: internal space, 58: member, 62h: heater

What is claimed is:

1. A plasma processing apparatus for executing a plasma processing, comprising:
    a chamber including a chamber body having a cylindrical shape and constituting a side wall of the chamber;
    a first member partially disposed in an internal space of the chamber;
    a second member extending in a circumferential direction with respect to a central vertical axis of the chamber body;
    an upper electrode;
    a heater unit configured to heat the first member;
    a spacer provided between the chamber body and the first member in a vertical direction; and
    wherein the first member extends outward from the internal space of the chamber and is exposed to a space outside the chamber,
    wherein the heater unit is formed as an annular plate,
    wherein an outer surface and a lower surface of the heater unit are at least partially in physical contact with the first member,
    wherein an inner surface and an upper surface of the heater unit are not in physical contact with the first member,
    wherein the spacer is exposed to the space outside the chamber,
    wherein the heater unit includes a main body and a heater provided inside the main body, and
    wherein the upper electrode, the second member, the heater unit, and the first member are arranged in order in a radially outward direction.

2. The plasma processing apparatus of claim 1, wherein the first member is made of aluminum.

3. The plasma processing apparatus of claim 1, wherein the spacer is made of a material having a thermal conductivity lower than that of aluminum.

4. The plasma processing apparatus of claim 3, wherein the spacer is made of a stainless steel.

5. The plasma processing apparatus of claim 4, wherein the first member extends along an inner wall of the chamber so as to suppress a byproduct generated by the plasma processing from accumulating on the inner wall of the chamber.

6. The plasma processing apparatus of claim 5, wherein the main body of the heater unit is provided so as to be in thermal contact with the first member.

7. The plasma processing apparatus of claim 6, further comprising:
    an upper component provided on the first member to be in thermal contact with the first member,
    wherein the upper component has a flow path to which a coolant is fed.

8. The plasma processing apparatus of claim 1, wherein the first member extends along an inner wall of the chamber so as to suppress a byproduct generated by the plasma processing from accumulating on the inner wall of the chamber.

9. The plasma processing apparatus of claim 1,
    wherein the main body of the heater unit is provided so as to be in thermal contact with the first member.

10. The plasma processing apparatus of claim 1, further comprising:
    an upper component provided on the first member to be in thermal contact with the first member,
    wherein the upper component has a flow path to which a coolant is fed.

11. The plasma processing apparatus of claim 1, wherein the spacer has a plate shape and extends in the circumferential direction with respect to the central vertical axis of the chamber body, and
    wherein the first member extends in the circumferential direction with respect to the central vertical axis.

12. The plasma processing apparatus of claim 1, further comprising:
    a ceiling portion provided so as to close an upper end opening of the chamber; and
    a third member having a substantially annular plate and being at least partially in contact with the lower surface of the heater unit.

* * * * *